United States Patent
Yudovsky

(10) Patent No.: US 9,631,277 B2
(45) Date of Patent: Apr. 25, 2017

(54) ATOMIC LAYER DEPOSITION CAROUSEL WITH CONTINUOUS ROTATION AND METHODS OF USE

(75) Inventor: Joseph Yudovsky, Campbell, CA (US)

(73) Assignee: Applied Materials, Inc., Santa Clara, CA (US)

(*) Notice: Subject to any disclaimer, the term of this patent is extended or adjusted under 35 U.S.C. 154(b) by 0 days.

(21) Appl. No.: 13/189,719

(22) Filed: Jul. 25, 2011

(65) Prior Publication Data
US 2012/0225195 A1 Sep. 6, 2012

Related U.S. Application Data

(63) Continuation of application No. 13/037,840, filed on Mar. 1, 2011, now abandoned.

(51) Int. Cl.
| | | |
|---|---|---|
| *C23C 16/458* | (2006.01) | |
| *B05D 5/12* | (2006.01) | |
| *C23C 16/455* | (2006.01) | |
| *C23C 16/54* | (2006.01) | |

(52) U.S. Cl.
CPC ...... *C23C 16/458* (2013.01); *C23C 16/45551* (2013.01); *C23C 16/45578* (2013.01); *C23C 16/54* (2013.01)

(58) Field of Classification Search
CPC .................. C23C 14/505; C23C 16/4584
USPC .......................................... 118/729
See application file for complete search history.

(56) References Cited

U.S. PATENT DOCUMENTS

| | | | |
|---|---|---|---|
| 5,124,557 A * | 6/1992 | Aitken | H01L 21/68 250/442.11 |
| 5,288,329 A | 2/1994 | Nakamura et al. | |
| 5,766,360 A | 6/1998 | Sato et al. | |
| 6,203,619 B1 | 3/2001 | McMillan | |
| 6,576,062 B2 * | 6/2003 | Matsuse | C23C 16/45519 118/719 |
| 6,789,499 B2 | 9/2004 | Voutsas et al. | |
| 6,821,563 B2 | 11/2004 | Yudovsky | |
| 7,214,027 B2 | 5/2007 | Stone | |
| 7,413,982 B2 | 8/2008 | Levy | |
| 7,456,429 B2 | 11/2008 | Levy | |
| 7,572,686 B2 | 8/2009 | Levy et al. | |
| 7,591,714 B2 | 9/2009 | Ko et al. | |

(Continued)

FOREIGN PATENT DOCUMENTS

| | | |
|---|---|---|
| KR | 10-0670762 | 1/2007 |
| KR | 20-2009-0001924 | 2/2009 |

(Continued)

OTHER PUBLICATIONS

PCT International Search Report and Written Opinion in PCT/US2012/027250, mailed Sep. 17, 2012, 12 pgs.

(Continued)

*Primary Examiner* — Parviz Hassanzadeh
*Assistant Examiner* — Nathan K Ford
(74) *Attorney, Agent, or Firm* — Servilla Whitney LLC

(57) ABSTRACT

Provided are atomic layer deposition apparatus and methods including a rotating wheel with a plurality of substrate carriers for continuous processing of substrates. The processing chamber may have a loading station on the front end which is configured with one or more robots to load and unload substrates from the substrate carriers without needing to stop the rotating wheel.

14 Claims, 4 Drawing Sheets

(56) References Cited

U.S. PATENT DOCUMENTS

| | | | |
|---|---|---|---|
| 7,789,961 | B2 | 9/2010 | Nelson et al. |
| 8,609,556 | B2 | 12/2013 | Van Gerwen et al. |
| 2004/0067641 | A1* | 4/2004 | Yudovsky .................... 438/680 |
| 2008/0014057 | A1 | 1/2008 | Juergensen et al. |
| 2008/0166880 | A1 | 7/2008 | Levy |
| 2008/0193643 | A1 | 8/2008 | Dip |
| 2009/0078204 | A1 | 3/2009 | Kerr et al. |
| 2009/0081366 | A1 | 3/2009 | Kerr et al. |
| 2009/0130858 | A1 | 5/2009 | Levy |
| 2009/0217878 | A1 | 9/2009 | Levy et al. |
| 2010/0050943 | A1 | 3/2010 | Kato et al. |
| 2010/0055312 | A1 | 3/2010 | Kato et al. |
| 2010/0116209 | A1 | 5/2010 | Kato |
| 2010/0124610 | A1* | 5/2010 | Aikawa ............... C23C 16/4584 427/255.28 |
| 2010/0248423 | A1 | 9/2010 | Nelson et al. |
| 2010/0260935 | A1 | 10/2010 | Kato et al. |

FOREIGN PATENT DOCUMENTS

| | | |
|---|---|---|
| KR | 10-2009-0055443 | 6/2009 |
| KR | 10-2009-0069075 | 6/2009 |
| KR | 10-0908987 | 7/2009 |
| KR | 10-0920324 | 10/2009 |
| KR | 10-0931331 | 12/2009 |
| KR | 10-2010-0002886 | 1/2010 |
| KR | 10-2010-0003536 | 1/2010 |
| KR | 10-0936694 | 1/2010 |
| KR | 10-0936695 | 1/2010 |
| KR | 10-0946159 | 3/2010 |
| KR | 10-0949913 | 3/2010 |
| KR | 10-0949914 | 3/2010 |
| KR | 10-0960958 | 6/2010 |
| KR | 10-2010-0077827 | 7/2010 |
| KR | 10-1028408 | 4/2011 |
| KR | 10-1028409 | 4/2011 |
| KR | 10-104661 | 7/2011 |
| KR | 10-1072670 | 10/2011 |
| KR | 10-1081694 | 11/2011 |
| KR | 10-1095687 | 12/2011 |
| KR | 10-1134277 | 4/2012 |
| KR | 10-1135853 | 4/2012 |
| KR | 10-1136302 | 4/2012 |
| TW | 200938656 | 9/2009 |
| TW | 201132792 | 10/2011 |

OTHER PUBLICATIONS

Non-Final Office Action in U.S. Appl. No. 13/037,840, dated Aug. 30, 2013, 18 pgs.

Poodt, Paul, et al., High-Speed Spatial Atomic-Layer Deposition of Aluminum Oxide Layers for Solar Cell Passivation, *Adv. Mater.* vol. 22 2010 3564-3567.

* cited by examiner

ATOMIC LAYER DEPOSITION CAROUSEL WITH CONTINUOUS ROTATION AND METHODS OF USE

This application is a continuation of U.S. patent application Ser. No. 13/037,840, filed Mar. 1, 2011, now abandoned which is incorporated herein by reference.

BACKGROUND

Embodiments of the invention generally relate to an apparatus and a method for depositing materials. More specifically, embodiments of the invention are directed to a atomic layer deposition chambers with a plurality of substrate carriers for continuous processing of substrates.

In the field of semiconductor processing, flat-panel display processing or other electronic device processing, vapor deposition processes have played an important role in depositing materials on substrates. As the geometries of electronic devices continue to shrink and the density of devices continues to increase, the size and aspect ratio of the features are becoming more aggressive, e.g., feature sizes of 0.07 µm and aspect ratios of 10 or greater. Accordingly, conformal deposition of materials to form these devices is becoming increasingly important.

During an atomic layer deposition (ALD) process, reactant gases are sequentially introduced into a process chamber containing a substrate. Generally, a first reactant is introduced into a process chamber and is adsorbed onto the substrate surface. A second reactant is then introduced into the process chamber and reacts with the first reactant to form a deposited material. A purge step may be carried out between the delivery of each reactant gas to ensure that the only reactions that occur are on the substrate surface. The purge step may be a continuous purge with a carrier gas or a pulse purge between the delivery of the reactant gases.

There is an ongoing need in the art for apparatuses and methods of rapidly and efficiently processing substrates by atomic layer deposition.

SUMMARY

Embodiments of the invention are directed to deposition systems comprising a processing chamber with a rotatable wheel. The rotatable wheel is disposed inside the processing chamber and has a plurality of circumferentially distributed substrate carriers. At least one gas distribution plate is inside the processing chamber. The gas distribution plate has a plurality of elongate gas ports configured to direct flows of gases toward the substrate carriers. A loading station is on the front end of the processing chamber. The loading station has a first robot for loading a substrate onto a substrate carrier and second robot for unloading a processed substrate from a substrate carrier. In detailed embodiments, the loading station is isolated from ambient environment.

In one or more embodiments, the loading station comprises a first substrate buffer region accessible to the first robot and a second substrate buffer region accessible to the second robot. In detailed embodiments, the first robot is configured to place a substrate onto a substrate carrier while the wheel is rotating without stopping the wheel. In specific embodiments, the second robot is configured to remove a substrate from a substrate carrier while the wheel is rotating without stopping the wheel.

In some embodiments, the deposition system further comprises at least one load lock chamber on a front end of the loading station. The load lock chamber isolates the loading station and the processing chamber from the ambient environment. In detailed embodiments, there are two load lock chambers, a first load lock chamber for introducing substrates to the loading station from the ambient environment and a second load lock chamber for removing processed substrates from the loading station. Specific embodiments, further comprise at least one third robot for transferring substrates to and from the at least one load lock chamber.

In various embodiments, the rotatable wheel is configured to rotate the substrate carriers clockwise and counterclockwise.

In detailed embodiments, the processing chamber further comprises a substrate heating station. In specific embodiments, the processing chamber further comprises a substrate carrier cleaning station for cleaning the substrate carrier after the second robot has removed the substrate from the substrate carrier and before the first robot has placed a substrate onto the substrate carrier.

In some embodiments, the processing chamber includes at least two gas distribution plates, each gas distribution plate configured to deposit different layers on the substrate.

Additional embodiments of the invention are directed to deposition system comprising a processing chamber having a rotatable wheel with a plurality of circumferentially distributed substrate carriers and at least one gas distribution plate. The at least one gas distribution plate has a plurality of elongate gas ports configured to direct flows of gases toward the substrate carriers. A loading station is on a front end of the processing chamber. The loading station has a first robot for loading a substrate onto a substrate carrier, a second robot for unloading a processed substrate from a substrate carrier, a first buffer region accessible to the first robot and a second buffer region accessible to the second robot. A first load lock chamber is on a front end of the loading station, the first load lock chamber accessible to the first robot. A second load lock chamber is on the front end of the loading station, the second load lock chamber accessible to the second robot.

Further embodiments of the invention are directed to methods of processing substrate. A wheel having a plurality of circumferentially distributed substrate carriers is rotated. A substrate is continuously placed with a first robot in a loading station onto each substrate carrier not holding a substrate. Placement is done without stopping the rotating wheel. Each substrate is processed sequentially while rotating on the wheel. A processed substrate is continuously removed with a second robot in the loading station from each substrate carrier holding a substrate without stopping the rotating wheel.

Some embodiments further comprise loading substrates from a first load lock chamber into the loading station with the first robot. Detailed embodiments further comprise placing the substrates into a first buffer region in the loading chamber with the first robot after loading the substrates into the loading chamber. Specific embodiments further comprise unloading substrates from the loading station into a second load lock chamber with the second robot. In particular embodiments, the substrates are placed into a second buffer region in the loading chamber with the second robot before unloading the substrates.

In some embodiments, the substrate carriers are passed adjacent a carrier cleaning station after a substrate has been removed from the carrier and before a substrate has been placed on the carrier. In detailed embodiments, the substrate is heated on a substrate carrier.

BRIEF DESCRIPTION OF THE DRAWINGS

So that the manner in which the above recited features of the invention are attained and can be understood in detail, a more particular description of the invention, briefly summarized above, may be had by reference to the embodiments thereof which are illustrated in the appended drawings. It is to be noted, however, that the appended drawings illustrate only typical embodiments of this invention and are therefore not to be considered limiting of its scope, for the invention may admit to other equally effective embodiments.

DETAILED DESCRIPTION

Embodiments of the invention are directed to atomic layer deposition apparatus and methods which provide improved movement of substrates. Specific embodiments of the invention are directed to atomic layer deposition apparatuses (also called cyclical deposition) incorporating a continuously rotating carousel.

Figure 1:
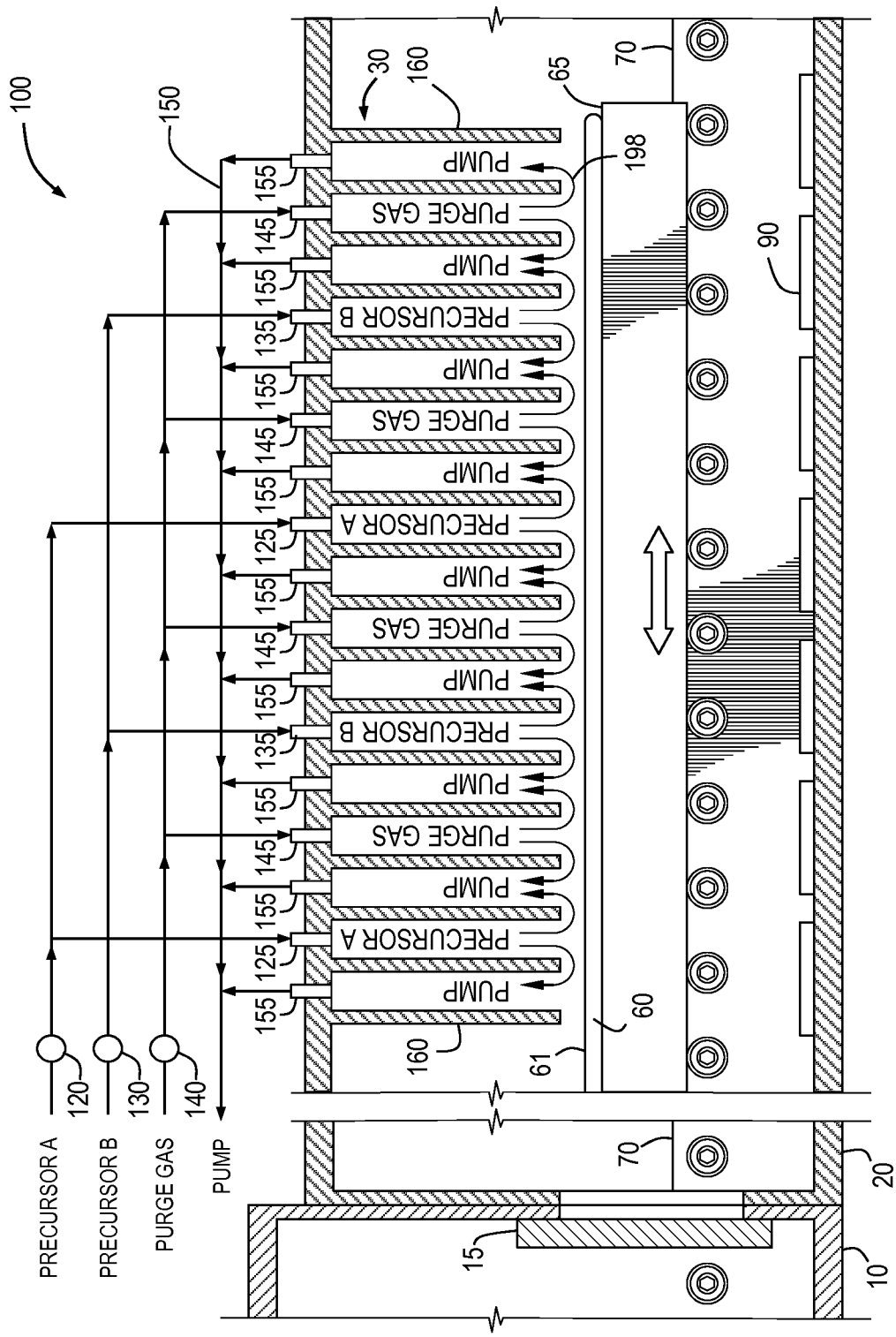
FIG. 1 shows a schematic cross-sectional side view of an atomic layer deposition chamber according to one or more embodiments of the invention.

FIG. 1 is a schematic cross-sectional view of an atomic layer deposition system 100 or reactor in accordance with one or more embodiments of the invention. The system 100 includes a load lock chamber 10 and a processing chamber 20. The processing chamber 20 is generally a sealable enclosure, which is operated under vacuum, or at least low pressure. The processing chamber 20 is isolated from the load lock chamber 10 by an isolation valve 15. The isolation valve 15 seals the processing chamber 20 from the load lock chamber 10 in a closed position and allows a substrate 60 to be transferred from the load lock chamber 10 through the valve to the processing chamber 20 and vice versa in an open position.

The system 100 includes a gas distribution plate 30 capable of distributing one or more gases across a substrate 60. The gas distribution plate 30 can be any suitable distribution plate known to those skilled in the art, and specific gas distribution plates described should not be taken as limiting the scope of the invention. The output face of the gas distribution plate 30 faces the first surface 61 of the substrate 60.

Substrates for use with the embodiments of the invention can be any suitable substrate. In detailed embodiments, the substrate is a rigid, discrete, generally planar substrate. As used in this specification and the appended claims, the term "discrete" when referring to a substrate means that the substrate has a fixed dimension. The substrate of specific embodiments is a semiconductor wafer, such as a 200 mm or 300 mm diameter silicon wafer.

The gas distribution plate 30 comprises a plurality of gas ports configured to transmit one or more gas streams to the substrate 60 and a plurality of vacuum ports disposed between each gas port and configured to transmit the gas streams out of the processing chamber 20. In the detailed embodiment of FIG. 1, the gas distribution plate 30 comprises a first precursor injector 120, a second precursor injector 130 and a purge gas injector 140. The injectors 120, 130, 140 may be controlled by a system computer (not shown), such as a mainframe, or by a chamber-specific controller, such as a programmable logic controller. The precursor injector 120 is configured to inject a continuous (or pulse) stream of a reactive precursor of compound A into the processing chamber 20 through a plurality of gas ports 125. The precursor injector 130 is configured to inject a continuous (or pulse) stream of a reactive precursor of compound B into the processing chamber 20 through a plurality of gas ports 135. The purge gas injector 140 is configured to inject a continuous (or pulse) stream of a non-reactive or purge gas into the processing chamber 20 through a plurality of gas ports 145. The purge gas is configured to remove reactive material and reactive by-products from the processing chamber 20. The purge gas is typically an inert gas, such as, nitrogen, argon and helium. Gas ports 145 are disposed in between gas ports 125 and gas ports 135 so as to separate the precursor of compound A from the precursor of compound B, thereby avoiding cross-contamination between the precursors.

In another aspect, a remote plasma source (not shown) may be connected to the precursor injector 120 and the precursor injector 130 prior to injecting the precursors into the processing chamber 20. The plasma of reactive species may be generated by applying an electric field to a compound within the remote plasma source. Any power source that is capable of activating the intended compounds may be used. For example, power sources using DC, radio frequency (RF), and microwave (MW) based discharge techniques may be used. If an RF power source is used, it can be either capacitively or inductively coupled. The activation may also be generated by a thermally based technique, a gas breakdown technique, a high intensity light source (e.g., UV energy), or exposure to an x-ray source. Exemplary remote plasma sources are available from vendors such as MKS Instruments, Inc. and Advanced Energy Industries, Inc.

The system 100 further includes a pumping system 150 connected to the processing chamber 20. The pumping system 150 is generally configured to evacuate the gas streams out of the processing chamber 20 through one or more vacuum ports 155. The vacuum ports 155 are disposed between each gas port so as to evacuate the gas streams out of the processing chamber 20 after the gas streams react with the substrate surface and to further limit cross-contamination between the precursors.

The system 100 includes a plurality of partitions 160 disposed on the processing chamber 20 between each port. A lower portion of each partition extends close to the first surface 61 of substrate 60. For example, about 0.5 mm or greater from the first surface 61. In this manner, the lower portions of the partitions 160 are separated from the substrate surface by a distance sufficient to allow the gas streams to flow around the lower portions toward the vacuum ports 155 after the gas streams react with the substrate surface. Arrows 198 indicate the direction of the gas streams. Since the partitions 160 operate as a physical barrier to the gas streams, they also limit cross-contamination between the precursors. The arrangement shown is merely illustrative and should not be taken as limiting the scope of the invention. It will be understood by those skilled in the art that the gas distribution system shown is merely one possible distribution system and the other types of showerheads may be employed.

In operation, a substrate 60 is delivered (e.g., by a robot) to the load lock chamber 10 and is placed on a shuttle 65. After the isolation valve 15 is opened, the shuttle 65 is moved along the track 70. Once the shuttle 65 enters in the processing chamber 20, the isolation valve 15 closes, sealing the processing chamber 20. The shuttle 65 is then moved through the processing chamber 20 for processing. In one embodiment, the shuttle 65 is moved in a linear path through the chamber.

As the substrate 60 moves through the processing chamber 20, the first surface 61 of substrate 60 is repeatedly exposed to the precursor of compound A coming from gas ports 125 and the precursor of compound B coming from gas ports 135, with the purge gas coming from gas ports 145 in between. Injection of the purge gas is designed to remove unreacted material from the previous precursor prior to exposing the substrate surface 61 to the next precursor. After each exposure to the various gas streams (e.g., the precursors or the purge gas), the gas streams are evacuated through the vacuum ports 155 by the pumping system 150. Since a vacuum port may be disposed on both sides of each gas port, the gas streams are evacuated through the vacuum ports 155 on both sides. Thus, the gas streams flow from the respective gas ports vertically downward toward the first surface 61 of the substrate 60, across the first surface 110 and around the lower portions of the partitions 160, and finally upward toward the vacuum ports 155. In this manner, each gas may be uniformly distributed across the substrate surface 61. Arrows 198 indicate the direction of the gas flow. Substrate 60 may also be rotated while being exposed to the various gas streams. Rotation of the substrate may be useful in preventing the formation of strips in the formed layers. Rotation of the substrate can be continuous or in discreet steps.

The extent to which the substrate surface 61 is exposed to each gas may be determined by, for example, the flow rates of each gas coming out of the gas port and the rate of movement of the substrate 60. In one embodiment, the flow rates of each gas are configured so as not to remove adsorbed precursors from the substrate surface 61. The width between each partition, the number of gas ports disposed on the processing chamber 20, and the number of times the substrate is passed back and forth may also determine the extent to which the substrate surface 61 is exposed to the various gases. Consequently, the quantity and quality of a deposited film may be optimized by varying the above-referenced factors.

In another embodiment, the system 100 may include a precursor injector 120 and a precursor injector 130, without a purge gas injector 140. Consequently, as the substrate 60 moves through the processing chamber 20, the substrate surface 61 will be alternately exposed to the precursor of compound A and the precursor of compound B, without being exposed to purge gas in between.

The embodiment shown in FIG. 1 has the gas distribution plate 30 above the substrate. While the embodiments have been described and shown with respect to this upright orientation, it will be understood that the inverted orientation is also possible. In that situation, the first surface 61 of the substrate 60 will face downward, while the gas flows toward the substrate will be directed upward. In one or more embodiments, at least one radiant heat source 90 is positioned to heat the second side of the substrate.

In some embodiments, the shuttle 65 is a susceptor 66 for carrying the substrate 60. Generally, the susceptor 66 is a carrier which helps to form a uniform temperature across the substrate. The susceptor 66 is movable in both directions (left-to-right and right-to-left, relative to the arrangement of FIG. 1) between the load lock chamber 10 and the processing chamber 20. The susceptor 66 has a top surface 67 for carrying the substrate 60. The susceptor 66 may be a heated susceptor so that the substrate 60 may be heated for processing. As an example, the susceptor 66 may be heated by radiant heat source 90, a heating plate, resistive coils, or other heating devices, disposed underneath the susceptor 66.

Figure 2:
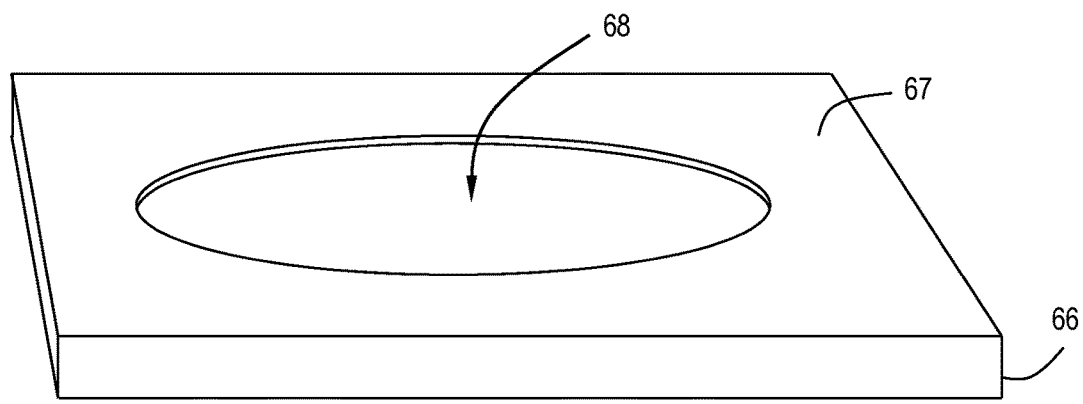
FIG. 2 shows a perspective view of a susceptor in accordance with one or more embodiments of the invention.

In still another embodiment, the top surface 67 of the susceptor 66 includes a recess 68 configured to accept the substrate 60, as shown in FIG. 2. The susceptor 66 is generally thicker than the thickness of the substrate so that there is susceptor material beneath the substrate. In detailed embodiments, the recess 68 is configured such that when the substrate 60 is disposed inside the recess 68, the first surface 61 of substrate 60 is level with the top surface 67 of the susceptor 66. Stated differently, the recess 68 of some embodiments is configured such that when a substrate 60 is disposed therein, the first surface 61 of the substrate 60 does not protrude above the top surface 67 of the susceptor 66.

Figure 3:
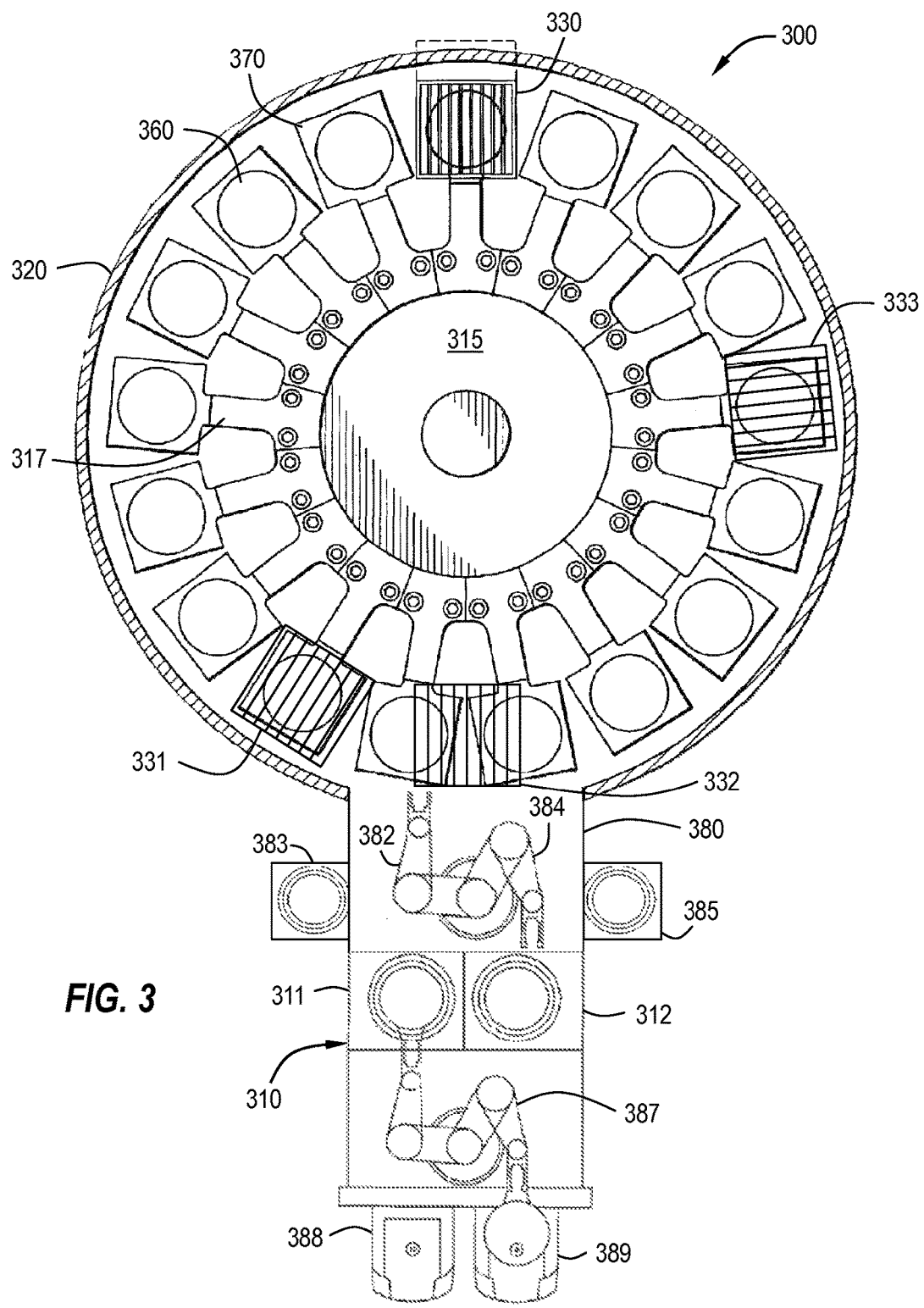
FIG. 3 shows a schematic top view of a processing chamber with loading station and load lock chamber in accordance with one or more embodiments of the invention.
Figure 4:
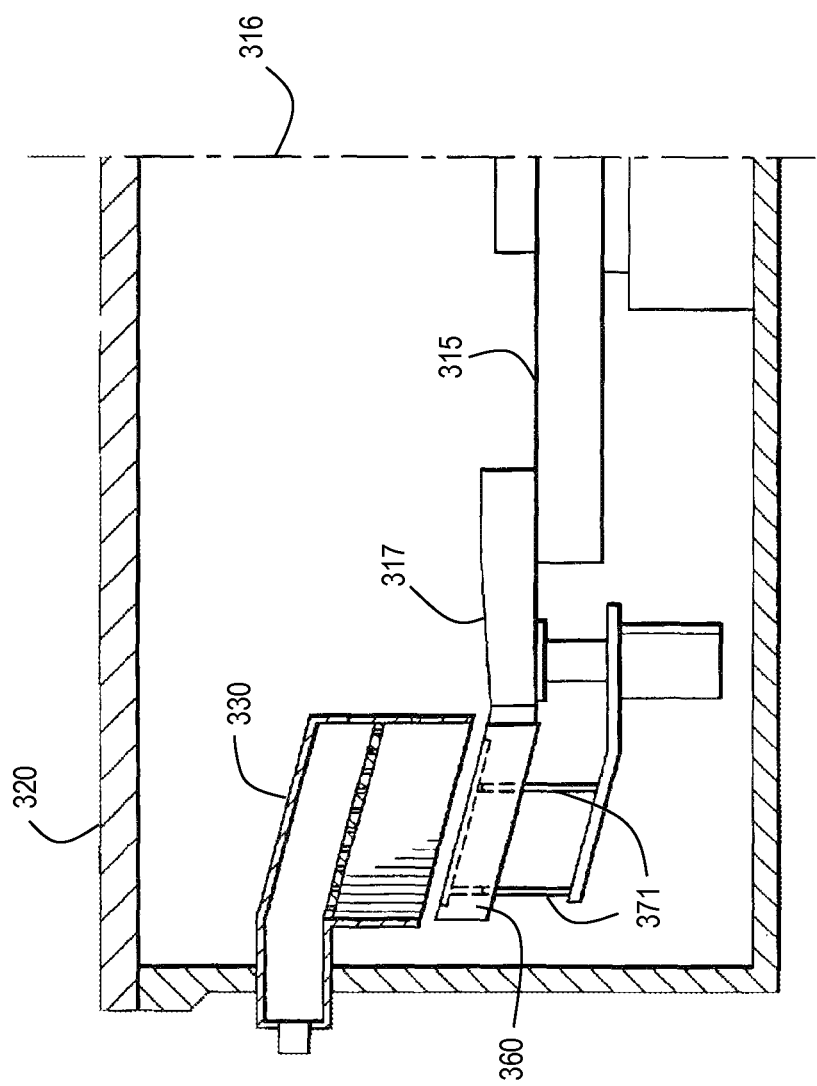
FIG. 4 shows a partial side view of an atomic layer deposition chamber in accordance with one or more embodiments of the invention.

Referring now to FIGS. 3 and 4, a deposition system 300 in accordance with another embodiment of the invention is illustrated. The system 300 includes a wheel 315 mounted inside a processing chamber 320. The wheel 315 is configured to rotate about an axis 316 (FIG. 4). In detailed embodiments, the wheel 315 rotates in both clockwise and counterclockwise directions. In specific embodiments, the wheel 315 is configured to switch rapidly between clockwise and counterclockwise rotation. As used in this specification and the appended claims, the term "switch rapidly" means that the rotational direction can be reversed in less than about 1 minute, or less than about 30 second, or less than about 20 seconds or less than about 10 seconds.

A rotatable wheel 315 is disposed inside the processing chamber 320. The wheel 315 includes a number of radial spokes 317, each having a substrate carrier 370 at its outer extremity. Stated differently, the wheel has a plurality of circumferentially distributed substrate carriers 370. Each substrate carrier 370 is configured to carry a substrate 360 through the processing chamber 320. The substrate supporting faces on the carrier 370 may be angled slightly radially inwards relative to the axis 316 of rotation of the wheel 315, so that on rotation, the substrates 360 may be pressed firmly against the faces through centrifugal force and reduce the risk of the substrates 360 sliding off of the substrate carrier 370.

The substrate carriers 370 may include a recessed area, like the susceptor of FIG. 2, or can have a flat surface. The substrate carriers 370 of some embodiments are configured to heat or cool the substrate during processing. Heating or cooling can be accomplished with a thermal element (not shown) which can be, for example, a resistive heater or a cooling plate. Heating or cooling can be done throughout the processing chamber 320 or in selected regions of the processing chamber 320.

The system 300 further includes at least one gas distribution plate 330. The gas distribution plate 330 includes a plurality of elongate gas ports, vacuum ports and partitions (as shown in FIG. 1) configured to direct flows of gases toward the substrate carriers 370, or toward a substrate 360 on the substrate carrier 370.

In operation, as the wheel 315 rotates, the substrate carriers 370 of the wheel 315 successively interrupt the various gas streams as they move underneath the gas distribution plate 30. The substrate carriers 370 are configured to intersect the various gas streams normal to the gas streams direction.

In detailed embodiments, the substrate carriers 370 are configured to rotate the substrate 360, in addition to the rotation of the wheel 315. Rotation of the substrate can be coaxial with the wheel 315 rotation, or can be in the opposite direction of the wheel 315 rotation. In specific embodiments, the substrate carriers 370 are configured to rotate in a direction opposite of the rotation of the wheel 315 at a speed sufficient to a substrate 360 passing adjacent the gas distribution plate 330 to have an inner radius and an outer radius with substantially equal residence times. Stated differently, without rotation of the substrate 360, the outer radius of the substrate will have a different angular velocity relative to the gas ports in the gas distribution plate 330 than the inner radius of the substrate.

The system 300 includes a loading station 380 mounted on a front end of the processing chamber 320. The loading station 380 has a first robot 382 and second robot 384. The first robot 382 is configured to load a substrate 360 onto a substrate carrier 370 and the second robot 384 is configured to unload a substrate 360 from a substrate carrier 370. Both the loading and unloading processes can be performed without changing the speed of rotation of the wheel 315. To accomplish this, the first robot 382 and second robot 384 are configured to pick up and drop substrates 360 while following the trajectory of the substrate 360 moving on the wheel 315. In operation, the first robot 382 can pick up a substrate from either a buffer region or a load lock and transfer it to a position, for example, above a substrate carrier 370. The first robot 382 places the substrate onto a set of lift pins 371 which are extended above the surface of the substrate carrier 370. The first robot, following the trajectory of the rotating wheel 315, withdraws from the area adjacent the substrate carrier 370 and the lift pins 371 lower to seat the substrate 360 onto the substrate carrier 370 for processing. Removal of a processed substrate is performed in a similar manner. The lift pins 371 raise to lift the substrate 360 from the substrate carrier 370. The second robot 384 is positioned, for example, below the substrate 360 and removes it from the lift pins 371 and into the loading station 380 where it can be placed into a buffer region or a load lock. In both the loading and unloading processes, the robots can remain level as the lift pins 371 perform all of the vertical motion of raising and lower the substrate both onto the substrate carrier and the robots or the robots can perform the vertical movement to lift and lower the substrate off of and onto, respectively, the lift pins 371.

The loading station 380 is an isolated region adjacent the processing chamber 320. The pressure in the loading station 380 will be the same as that of the processing chamber 320. Generally, both the loading station 380 and processing chamber 320 are under partial vacuum, or at least have different pressure and environments than the ambient environment. As used in this specification and the appended claims, the term "ambient environment" means the environment of the space in which the system 300 is located. For example, if the system 300 is located in a class 100 clean room, than the air in the clean room would be the ambient environment. In detailed embodiments, the loading station 380 is isolated from atmospheric pressure.

Detailed embodiments of the invention are directed to methods of processing a substrate. A wheel 315 having a plurality of circumferentially distributed substrate carriers 370 is rotated. Substrates 360 are continuously placed onto each substrate carrier 370, not already holding a substrate, with a first robot 382 positioned in a loading station 380 without stopping the rotating wheel 315. Each substrate 360 is processed sequentially with at least one gas distribution plate 330 while rotating on the wheel 315. The processed substrates 360 are continuously removed from the substrate carriers 370 by a second robot 384 in the loading station 380 without stopping the rotating wheel 315.

The deposition system 300 includes at least on load lock chamber 310 on a front end of the loading station 380. The load lock chamber 310 isolates the loading station 380 and the processing chamber 320 from the ambient environment. Any substrate 60, or cassette of substrates entering the processing chamber 320 and the loading station 380 pass through the load lock chamber 310 in which the ambient environment is replaced with the conditions in the processing chamber 320 and loading station 380. In detailed embodiments, there are two load lock chambers 310, a first load lock chamber 311 for introducing substrates 360 to the loading station 380 from the ambient environment and a second load lock chamber 312 for removing processed substrates 360 from the loading station 380. The load lock chambers 310 are configured to handle single substrates or a cassette of substrate. In some embodiments, the first robot 382 moves a substrate from a cassette in the first load lock chamber 311 and transfers it to the lift pins 371 on the substrate carrier 370, and the second robot 384 moves a substrate 360 from the lift pins 371 of a substrate carrier 370 to a cassette in the second load lock chamber 312.

The loading station 380 shown in FIG. 3 includes a first substrate buffer region 383 accessible to the first robot 382 and a second substrate buffer region 385 accessible to the second robot 384. The substrate buffer regions are can be used to store a supply of substrates so that the continuous processing is not interrupted when a new cassette of substrates is loaded into the chamber, or a processed cassette of substrates is removed from the chamber through the load locks. In specific embodiments, both the first robot 382 and the second robot 384 can access both the first buffer region 383 and the second buffer region 385. In some embodiments, the first robot 382 moves an entire cassette of substrates from the first load lock 311 to the first buffer region 383. The first robot 382 can then move each of the substrates in the substrate cassette from the first buffer region 383 to the substrate carrier 370 and the second robot 384 can move the processed substrates from the substrate carrier 370 to a cassette in the second buffer region 385. The second robot 384 can move the entire cassette from the second buffer region 385 to the second load lock 312 for removal. Specific embodiments include at least one third robot 387 (two are shown in FIG. 3) for transferring substrates to and from the load lock chamber 310. The at least one third robot 387 can move substrates from a loading port 388 to the load lock chamber 310 and from the load lock chamber 310 to an unloading port 389.

In detailed embodiments, when the cassette in the first buffer region 383 is empty and the cassette in the second buffer region 385 is full, which may happen at the same time, the second robot 384 moves the full cassette to the second load lock chamber 312, the first robot 382 moves the empty cassette from the first buffer region 383 to the second buffer region 385 and either robot moves a new cassette of substrates from the first load lock chamber 311 to the first buffer region 383. In this manner, the rotation of the carousel does not need to be interrupted because a supply of substrates is always available. A third load lock chamber (not shown) may also serve as an additional buffer region which can allow the robots to have access to an additional supply of substrates while the first load lock chamber 311 and second load lock chamber 312 are open to the ambient environment and closed to the loading station 380. The configuration of the hardware for cassette exchange depend on a number of factors, including but not limited to, the speed of the wheel 315 and the amount of time needed for the robots to exchange substrates and move cassettes.

Detailed embodiments of the processing chamber 320 further comprise a substrate heating station 331 which is used to elevate the temperature of the substrate for processing. The substrate heating station 331 can be any suitable heater known to those skilled in the art. Suitable heaters include, but are not limited to radiative heaters, resistive heaters and hot gases.

In some embodiments, the processing chamber 320 further comprises a substrate carrier cleaning station 332 for cleaning the substrate carrier 370 after the second robot 384 has removed the substrate 360 from the substrate carrier 370 and before the first robot 382 has placed a substrate 360 onto the substrate carrier 370. The substrate cleaning station 332 of specific embodiments cleans the substrate carrier 370 with a plasma.

In one or more embodiments, the processing chamber 320 includes at least two gas distribution plates, shown in FIG. 3 as gas distribution plate 330 and gas distribution plate 333 that can used, for example, for processes such as etching and deposition. In detailed embodiments, each of the gas distribution plates is configured to deposit layers onto the substrate having the same composition. In specific embodiments the gas distribution plate 330 deposits a different layer onto the substrate than the gas distribution plate 333.

Although FIG. 3 shows two gas distribution plates 330, 333, one carrier cleaning station 332 and one substrate heating station 331, it will be understood that any number of gas distribution plates, heating stations, cooling stations, cleaning stations (for both substrate and carrier) can be included in the processing chamber 320 to allow for continuous multi-layer processing of many substrates. The various distribution plates can be placed in multiple positions and should not be taken as limited to the positions and numbers shown in the figures.

Although the invention herein has been described with reference to particular embodiments, it is to be understood that these embodiments are merely illustrative of the principles and applications of the present invention. It will be apparent to those skilled in the art that various modifications and variations can be made to the method and apparatus of the present invention without departing from the spirit and scope of the invention. Thus, it is intended that the present invention include modifications and variations that are within the scope of the appended claims and their equivalents.

What is claimed is:

1. A deposition system for processing a plurality of substrates, comprising:
   a processing chamber;
   a rotatable wheel disposed inside the processing chamber, the wheel having a plurality of circumferentially distributed substrate carriers to carry one of the plurality of substrates, the substrate carriers having a set of lift pins configured to move between a lower position to seat a wafer on a surface of the substrate carrier and a position extended above a surface of the substrate carrier to lift a wafer above the surface of the substrate carrier;
   a plurality of gas distribution plates circumferentially arranged in the processing chamber such that each of the plurality of circumferentially distributed substrate carriers pass under the plurality of gas distribution plates as the rotatable wheel rotates, each of the plurality of gas distribution plates including a plurality of elongate gas ports to direct flows of gases toward the plurality of substrate carriers;
   a loading station on a front end of and within the processing chamber having a first multi-jointed robot mounted within the loading station to load one of the plurality of substrates onto one of the plurality of substrate carriers and a second multi-jointed robot mounted within the loading station to unload another of the plurality of substrates from one of the plurality of substrate carriers, wherein the first robot and the second robot follow the motion of the rotating wheel while loading and unloading; and
   a controller configured to rotate the rotatable wheel and to move the first multi-jointed robot and the second multi-jointed robot to follow the motion of the rotating wheel to load and unload wafers from the lift pins without slowing the rotation of the rotatable wheel, the controller further configured to raise and lower the set of lift pins to raise and lower a wafer from the surface of the substrate carrier to allow the first multi-jointed robot and the second multi-jointed robot to load and unload wafers from the substrate carriers without slowing the rotation of the rotatable wheel.

2. The deposition system of claim 1, wherein the loading station is isolated from ambient environment.

3. The deposition system of claim 1, further comprising at least one load lock chamber on a front end of the loading station, the load lock chamber isolating the loading station and the processing chamber from the ambient environment.

4. The deposition system of claim 1, wherein there are two load lock chambers, a first load lock chamber to introduce substrates to the loading station from the ambient environment and a second load lock chamber to remove processed substrates from the loading station.

5. The deposition system of claim 1, wherein each of the plurality of substrate carriers rotates in addition to the rotation of the rotatable wheel while the rotatable wheel is rotating.

6. The deposition system of claim 5, wherein the substrate carriers are configured to rotate the substrate in a direction opposite the direction of rotation of the rotatable wheel.

7. The deposition system of claim 6, wherein the substrate carriers are configured to rotate in the opposite direction at a speed sufficient so that a wafer passing the gas distribution plate would have equal residence times at an inner radius and an outer radius of the wafer.

8. The deposition system of claim 1, wherein the plurality of gas distribution plates deposits different layers on the substrate.

9. The deposition system of claim 1, further comprising a substrate carrier cleaning station in the processing chamber, and a substrate heating station circumferentially arranged in the processing chamber such that each of the plurality of circumferentially distributed substrate carriers pass under the substrate heating station as the rotatable wheel rotates.

10. The deposition system of claim 9, wherein the substrate carrier cleaning station is circumferentially arranged in the processing chamber with the gas distribution plates and the substrate heating station.

11. The deposition system of claim 1, further comprising a heating station circumferentially arranged within the processing chamber with the plurality of gas distribution plates such that each of the plurality of circumferentially distributed substrate carriers pass under the heating station.

12. The deposition system of claim 11, wherein the heating station comprises a radiant heat source directed at a top surface of the substrate carriers.

13. The deposition system of claim 11, further comprising a radiant heat source under the substrate carriers.

14. The deposition system of claim 1, wherein the loading station further comprises a first substrate buffer region accessible to the first robot and a second substrate buffer region accessible to the second robot.

* * * * *

UNITED STATES PATENT AND TRADEMARK OFFICE
CERTIFICATE OF CORRECTION

PATENT NO. : 9,631,277 B2  
APPLICATION NO. : 13/189719  
DATED : April 25, 2017  
INVENTOR(S) : Yudovsky Page 1 of 1

It is certified that error appears in the above-identified patent and that said Letters Patent is hereby corrected as shown below:

On the Title Page

Page 2, item (56), Column 2, under "Foreign Patent Documents", Line 11, delete "10-104661" and insert -- 10-1046611 --, therefor.

Signed and Sealed this  
Third Day of October, 2017

Joseph Matal  
*Performing the Functions and Duties of the*  
*Under Secretary of Commerce for Intellectual Property and*  
*Director of the United States Patent and Trademark Office*